SEMICONDUCTOR DEVICES MANUFACTURE

Original Filed May 10, 1971

United States Patent Office 3,836,446

Patented Sept. 17, 1974

3,836,446

SEMICONDUCTOR DEVICES MANUFACTURE

Karl H. Tiefert, Los Altos, Calif., assignor to Raytheon Company, Lexington, Mass.

Original application May 10, 1971, Ser. No. 141,857, now abandoned. Divided and this application Sept. 20, 1972, Ser. No. 290,593

Int. Cl. C23b *5/50;* C23c *13/02, 15/00*

U.S. Cl. 204—192 19 Claims

ABSTRACT OF THE DISCLOSURE

Semiconductor structures having multi-layer metal conductors formed on the surface of the semiconductor devices and having excess metal between the conductors removed by sputter etching in an atmosphere which produces oxidization of one of the metal layers of said conductors. The metal compound mask thus formed inhibits the etching process in the regions where the oxidized layer is exposed and protects the active components beneath the layer. The oxidized portions of the masking layer are then removed by a suitable solvent or etch. A chemical etching metal compound mask may be formed of a metal and the semiconductor material for separating the chips from the wafer by anisotropic etching.

This is a division of application Ser. No. 141,857, filed May 10, 1971, now abandoned.

BACKGROUND OF THE INVENTION

Semiconductor integrated circuit devices have been formed with connecting leads deposited on the active element side of a semiconductor chip by vapor deposition using a metal, such as aluminum, with the undesired portions being oxidized through a mask and removed by etching. Such structures have undesirable operating characteristics since the aluminum may interact, for example when subjected to high current surges, with the active semiconductor elements producing ion migration or other deleterious defects.

Multiple layer metal lead systems have been used in which layers of titanium and platinum are deposited on a semiconductor region and the layers were selectively removed by etching through a photoresist mask. This process etches some metal underneath the mask and reduces the precision of location and extent of the etched regions. In addition, since the different layers of metals requires different etches, a series of etching steps is required thereby increasing the production costs.

SUMMARY OF THE INVENTION

This invention provides for controlling the etching of semiconductor devices with a mask formed of a metal compound. The mask may be, for example formed by forming an apertured layer of a light metal such as titanium on the surface to be etched, and sputter etching the surface in an atmosphere having a constituent which reacts with the metal to produce a layer which sputter etches more slowly than the material which is exposed through the apertures and which is to be removed by etching. Since sputter etching does not substantially undercut an etching mask highly precise location and shape of etched regions can be achieved. This precision can be further enhanced by using the metal compound mask of this invention for sputter etching since sputter etching will somewhat enlarge the apertures in a photoresist mask, but will not substantially enlarge the apertures in the metal compound which is continuously formed during the etching process.

This invention further discloses that the mask may be formed of a metal which makes up a portion of the semiconductor leads and may be used as a stopping layer for a sputter etch in regions between the leads, so that several layers of different materials may be removed by a single sputter etching step and the sputter etching process will stop automatically when the stopping layer is reached. This is achieved by coating the surface of a semi-conductor chip containing active elements, whose surface regions have been passivated by a passivation layer having openings at the contact points to said elements, with a first layer of masking metal such as titanium, a second layer of barrier metal such as platinum, which prevents penetration of undesired metal into the semiconductor material, and a third layer of metal, such as gold, which is preferably the same metal as that used in the leads. The lead regions are then demarked on the gold layer by a conventional photoresist mask through which the leads are plated to a thickness substantially greater than the combined thickness of the three lower layers.

The excess lead material between the lead members as well as the barrier layer material can then be removed by removing the photoresist mask and sputter etching the surface in an oxidizing atmosphere at reduced pressure which removes only a small portion of the surface of the plated leads, but removes all of the lead metal layers and barrier metal layer between the leads. However, due to the oxidizing atmosphere the masking layer is oxidized and prevents further sputter etching so that the entire wafer may have all of the regions between the leads freed of lead layer metal and barrier layer metal without removing sufficient masking layer metal to damage the passivation layer and active semiconductor regions. The exposed masking layer metal is then removed by a chemical etch.

This invention further discloses that integrated semiconductor circuits may be readily formed with interconnections of different elements of the circuit through multilayer conductors which cross over, and are insulated from, each other. Sputter etching in an atmosphere which forms a metal compound with at least one of the metal layers is used to remove excess metal between the interconnectors.

This invention further discloses that a metal compound mask may be used to separate the chip from the semiconductor wafer after the active semiconductor elements have been formed.

More specifically, the side of a silicon wafer, opposite to the side containing the active elements, is coated with a metal such as platinum, and a photoresist mask having apertures formed therein where the chip is to be separated from the wafer. The platinum in the apertures of the mask is removed by chemical etching, the photoresist mask is removed by a solvent, the platinum layer thermally converted to platinum silicide, and the wafer subjected to chemical etching through the apertures in the platinum silicide. If the wafer surfaces are perpendicular to the [100] crystallographic axis, an etch such as sodium hydroxide may be used which will etch through the wafer faster than it will etch along the wafer surface, thereby providing an anisotropic, or preferential etch. Indicating nomenclature may, if desired, be also formed in the platinum silicide layer which is retained on the finished chip.

DESCRIPTION OF THE DRAWINGS

FIG. 8 illustrates an embodiment of the invention wherein a second layer of interconnecting conductors is formed over the first layer of conductors and insulated therefrom.

DESCRIPTION OF THE PREFERRED EMBODIMENT

Figure 1:
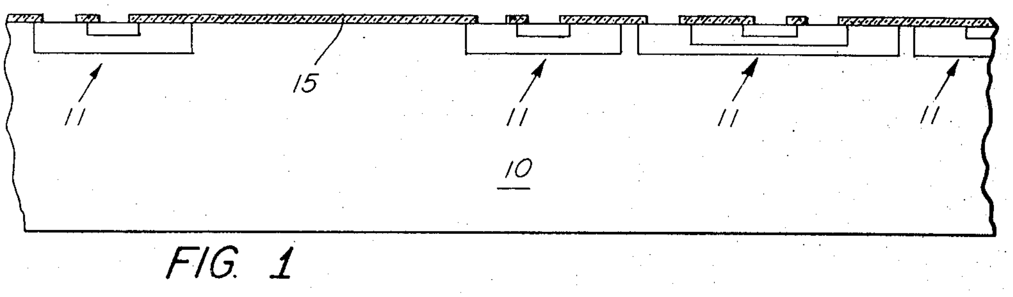
FIG. 1 illustrates a cross-sectional view of a semiconductor body having active semiconductor elements formed therein.

Referring now to FIG. 1, there is shown a portion of a semiconductor wafer 10 having a plurality of active semiconductor elements 11 formed in an epitaxial layer on one surface of the wafer. As illustrated herein, the active semiconductor elements are a diode and a transistor; however, any desired active and/or passive combination of semiconductor elements could be formed on the surface of the wafer 10 in accordance with well known practice. While any desired crystallographic orientation may be chosen for the wafer 10, it is preferred that the [100] crystallographic plane be oriented parallel to the epitaxial layer.

The surface containing the epitaxial layer is preferably passivated in accordance with well known practice after the diffusion steps are done through a silicon dioxide mask, for example, by forming a layer of silicon nitride on the surface of the silicon dioxide to provide a combined surface dielectric layer 15. Apertures are formed in the layer 15 in accordance with well-known practice by means of a photoresist mask and etching process in the regions where it is desired to make contact with the semiconductor elements. The contact regions are coated with platinum and heated to produce a surface layer of platinum silicide (not shown).

Figure 2:
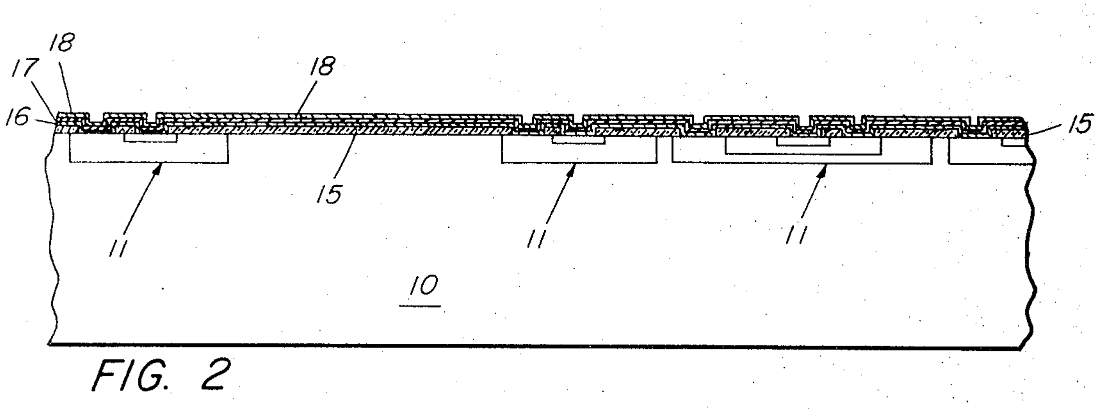
FIG. 2 illustrates the body of FIG. 1 with additional coatings of metal interconnecting layers between the elements.

Referring now to FIG. 2 there is shown the body illustrated in FIG. 1 in which a three layer metal coating has been formed on the passivated surface with portions of the metal extending through the openings in the passivated layer and contacting the active semiconductor elements. The surface is first coated with a uniform layer of a light metal 16 such as titanium, having a thickness of, for example, 1000 to 2000 angstroms by vacuum deposition or sputtering. While other materials may be used, it has been found that titanium produces a good bond with semiconductor material and hence produces reliable devices. The surface is then coated by vacuum deposition or sputtering with a barrier layer 17 of metal, such as platinum, having a thickness of, for example, 3000 angstroms. This provides isolation between the semiconductor material and the conductive lead metal, such as gold which might otherwise penetrate into the semiconductor region during elevated temperature periods. The surface is then coated with a layer 18 of lead metal such as gold which may be, for example, 2000 angstroms thick on which the leads are to be formed by electrodeposition.

Figure 3:
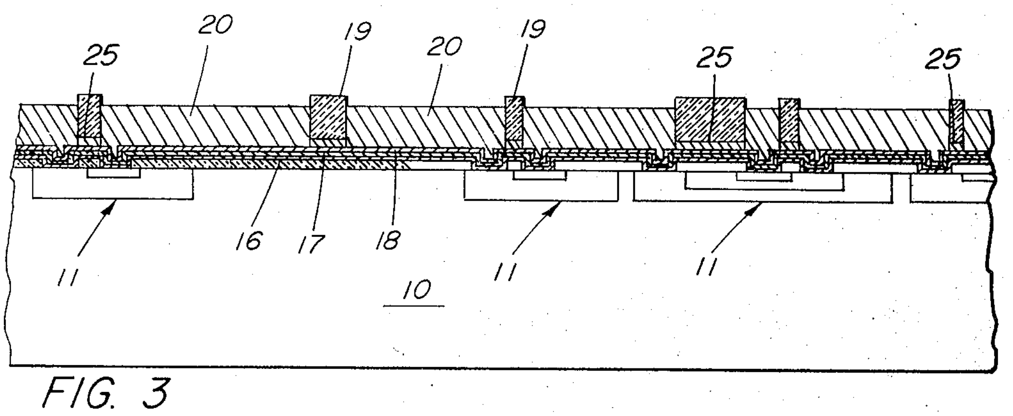
FIG. 3 illustrates a semiconductor body of FIG. 2 with the leads formed thereon.

Referring now to FIG. 3, the three layers 16, 17 and 18 are covered with a photoresist mask 19 having openings therein to expose regions of the surface of the layer 18 where the heavy metallic leads 20 are to be formed. Preferably, a layer 25 of metal such as titanium is formed by vacuum deposition or sputtering between the gold layer 18 and the photoresist mask 19. Layer 25 may be, for example 500 angstroms thick, and the portions exposed through the opening in mask 19 are removed by chemical etching in a solution of, for example, 10 parts of a 40% solution of $NH_4OH$ and 1 part of a 40% solution of HF. The wafer is placed in an electrolytic bath and the gold leads are built up as indicated at 20 to a depth of, for example, .0001" by electrodeposition. Titanium layer 25 aids in preventing excessive mushrooming of the plated region beyond the edges of the original openings formed in mask 19. Mask 19 is then removed by a solvent in accordance with well-known practice and layer 25 is removed by etching in a solution of $H_2O_2$ and $NH_4OH$.

Figure 4:
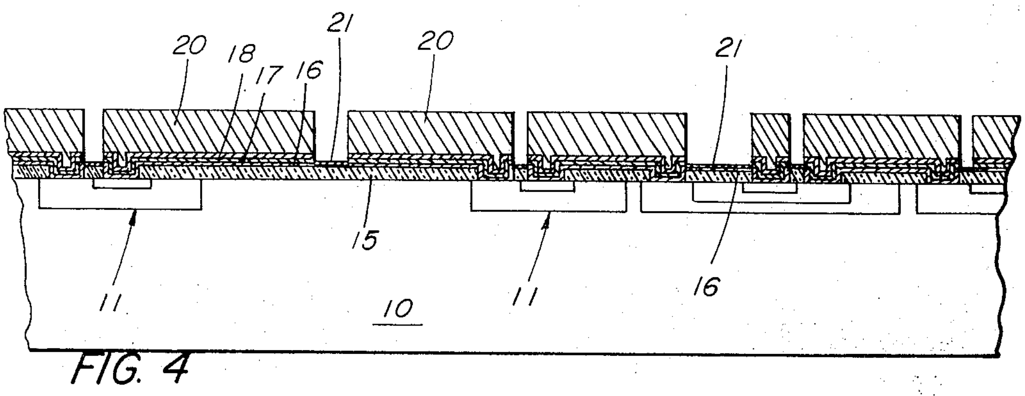
FIG. 4 illustrates the body of FIG. 3 with the metal formed between the leads and desired interconnecting regions removed by sputter etching.

Referring now to FIG. 4 there is shown the wafer and plated lead structure of FIG. 3. The wafer is sputter etched in an argon oxygen atmosphere which removes a small portion of the leads 20 and the layers 18 and 17 until the titanium layer 16 is reached which oxidizes to form a titanium dioxide layer 21.

The rate at which the titanium dioxide layer 21 is sputter etched in the argon atmosphere is very substantially slower than the rate at which any of the other materials exposed to sputter etching process are removed and as such it may be regarded as a barrier.

The titanium dioxide layer 21 is subsequently removed by chemical etching in a solution of $H_2SO_4$ and $H_2O_2$. Thus, it may be seen that integrated circuits formed in accordance with this invention may have the active elements positioned more closely and more accurately than has heretofore been possible and the production rate may be increased without increase in rejection of faulty units by accidental etching through to the active semiconductor elements.

The sputter etching rate varies with the etching current which may be adjusted to any desired density of the region to be etched and the voltage between the electrode and the semiconductor may be adjusted at any desired level. It has been found that this sputter etching process may be used to remove layers of materials such as gold, platinum, copper, silicon dioxide and silicon nitride up to 50,000 angstroms thick while masking adjacent areas with a thin titanium mask only 1000 to 2000 angstroms thick since as the titanium dioxide formed on the surface of the titanium layer is removed by sputter etching additional titanium dioxide is formed with the sublayer of titanium continuously.

It has also been found that the sputter etching, which is preferably carried out with an RF voltage, produces some redepositing material sputtered from other portions of the target electrode, of the discharge back on to the work being sputter etched, and such back deposition can be minimized by using a sputter etching target as a substrate holder for the work, which target is made of a light metal such as titanium or aluminum. It is contemplated that this invention can be used in a variety of processes other than the removal of interconnecting metal between the leads of semiconductor integrated circuits. For example, it is particularly applicable in those processes where photoresist masks would deteriorate such as processes carried out at elevated temperatures. In addition, the light metal dioxide mask will not shrink or change shape to any substantial extent while the photoresist mask will change shape under a variety of conditions. It is also contemplated that any desired metal and gas constituent could be used which would react during the sputtering process to form the masking component and that the remainder of the atmosphere can be made up with any other gas which does not react and more specifically it is contemplated that any of the noble gases can be employed.

Figures 5, 6:
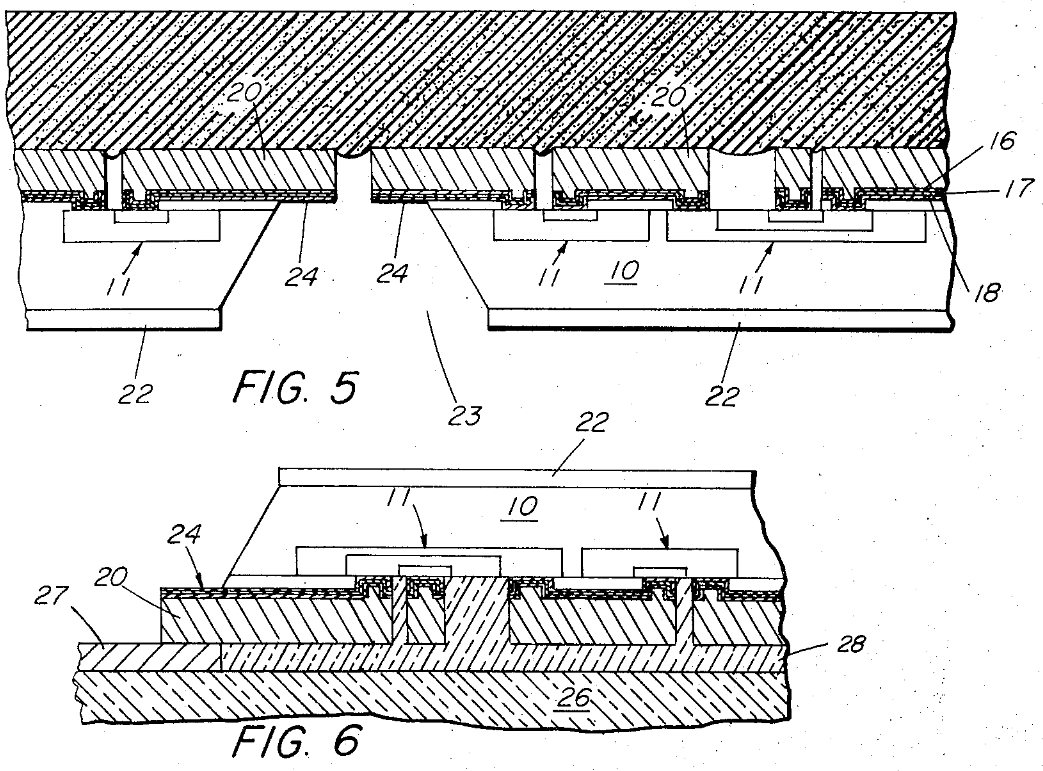
FIG. 5 illustrates the semiconductor body separated into portions by preferential etching.
FIG. 6 illustrates one of the portions of the body of FIG. 5 attached to a substrate having interconnecting leads.

Referring now to FIG. 5, there is shown the wafer 10 with the interconnecting leads 20 formed to interconnect for the active elements 11 and to connect the active elements with external circuitry. The wafer 10 is segregated into chips each containing several of the active elements 11 by removing sufficient semiconductor material from the opposite surface of the wafer to obtain a wafer of a uniform thickness of, for example, several mils, coating the back surface of the wafer with a photoresist mask 22 forming platinum silicide in the unmasked regions, removing the mask to expose the silicon wafer in the desired separation regions, and etching the separation regions with an etching solution, such as sodium hydroxide, which will have a preferential etching characteristic. If the semiconductor is silicon having the [100] crystallographic plane parallel to the epitaxial layer, such a preferential etch will etch in a direction normal to the [100] crystallographic plane at a substantially greater rate than in a direction parallel thereto.

Referring now to FIG. 6, there is shown the semiconductor portion 10 having the active elements 11 positioned face down on a supporting substrate 26 which may be of plastic, ceramic or fiber board. A plurality of interconnecting leads 27 on substrate 26 have portions contacting the projecting portions 24 of the leads 20 which are exposed for the application of a welding electrode by means of which the portions 24 are welded to the conductors 27. It is contemplated that any other desired bonding process such as soldering may be used. The space between the body 10 and the substrate 25 in between the conductors 27 and the leads 20 may be filled with any desired insulating material 28 such as epoxy resin to aid in the transfer of heat generated from the semiconductor chip to the substrate 25.

Figures 7, 8A, 8B:
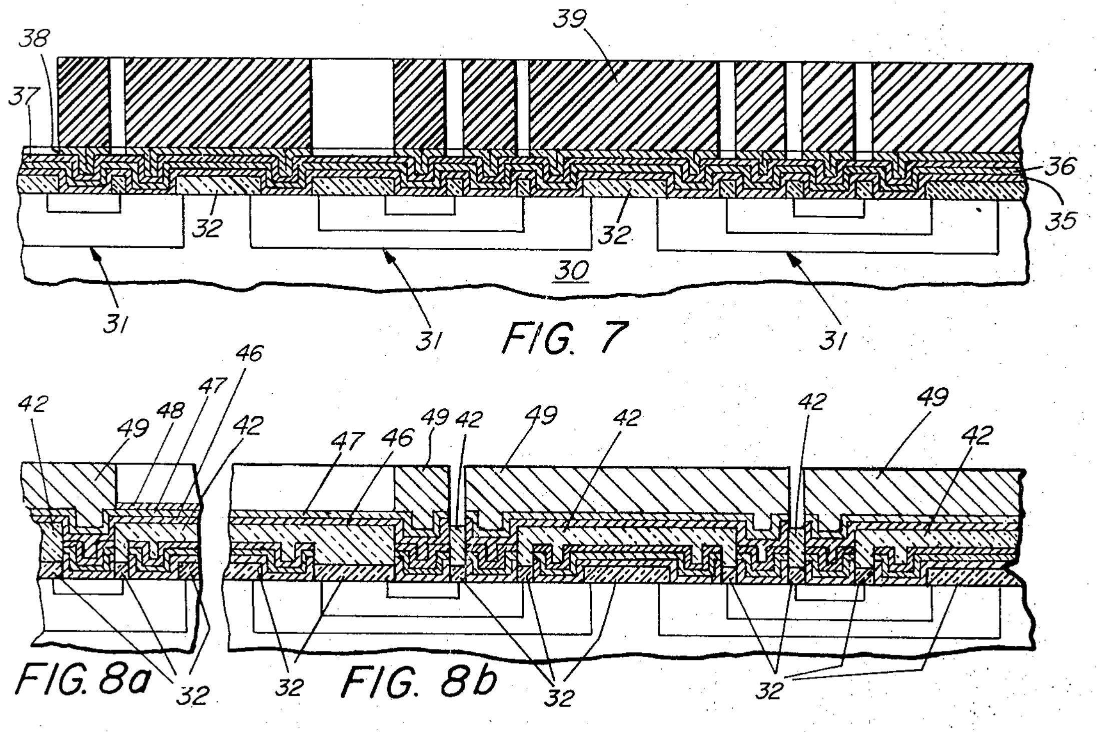
FIG. 7 illustrates a further embodiment of the invention in which a first layer of interconnecting conductors is formed on a semiconductor body.

Referring now to FIG. 7, there is shown an embodiment of the invention wherein multiple layer interconnection of components of elements can be achieved. A substrate having an epitaxial layer 30 thereon has components 31 of any desired type formed in the layer and extending to the surface of said layer. Components 31 may be of any desired type such as transistors, diodes or resistors formed by diffusion techniques in accordance with well known practice.

In the regions where the first interconnects are to be formed, apertures are formed in a layer 32 formed on the surface of the epitaxial layer 30. Layer 32 may be, for example, silicon dioxide passivated with a layer of silicon nitride. The apertures in layer 32 are formed by masking the surface with a photoresist, exposing and developing the photoresist and dissolving the developed regions where the apertures are to be formed in accordance with well-known practice. The portions of layer 32 exposed through the apertures in the photoresist mask are then removed by etching, in accordance with well-known practice to expose the silicon regions in the epitaxial layer 30 and the platinum silicide contacts are formed as previously described.

Layers of titanium 35, platinum 36, gold 37 and titanium 38 are then applied by vapor deposition or sputtering. Titanium layer 35 may be, for example, approximately 1000 angstroms thick, platinum layer 36 approximately 3000 angstroms thick, gold layer 37 approximately 10,000 angstroms thick and titanium layer 38 approximately 1500 angstroms thick.

Regions other than the regions above the apertures in layer 32 and the regions where cross connectors between elements are to be made by layers 35, 36 and 37, are then demarked by being exposed through a photoresist mask 39 to a chemical etch to remove titanium layer 38. The etch is, for example, 10 parts of a 40% solution of $NH_4OH$ and 1 part of a 40% solution of HF.

The photoresist layer is then removed by a conventional solvent and the portions of layers 36 and 37 not covered by the layer 38 are then removed by sputter etching in an oxidizing atmosphere such as low pressure argon and oxygen which removes these layers but oxidizes the exposed regions of titanium layers 35 and 38 to produce a titanium compound which sputter etches at a substantially lower rate than layers 36 and 37 thereby masking such regions. The titanium also produces good adherence with silicon and with other metals such as platinum layer 36 which prevents diffusion of gold layer 38 into the silicon at elevated processing and/or operating temperatures.

Sputter etching substantially reduces undercutting of adjacent masked regions. It is contemplated that other layers besides titanium could be used to provide the dual purpose of interconnecting the silicon elements with the metallic circuits and forming compounds with the sputter etching atmosphere which resist sputter etching to a greater degree than the metal elements.

The exposed portions of layer 35 and the remainder of layer 38 which served as a sputter etching mask are then removed by chemical etching, for example, by a solution of 7 parts of a 95% solution of $H_2SO_4$ and 3 parts of a 30% solution of $H_2O_2$, so that the passivation layer 32 is exposed between the leads made up of the remainder of layers 35, 36 and 37.

FIG. 8 shows a final layer of interconnections formed on the structure of FIG. 7 by the following steps. A layer 42 of silicon dioxide is sputtered onto the entire surface covering the exposed portion of layers 32 and 37, apertures are opened in the layer 42, where interconnections are desired with layer 37, through a photoresist by etching in accordance with well-known practice, and the photoresist mask is then removed.

A layer of titanium 46, 300 angstroms thick, a layer of gold 47, 1000 angstroms thick, and a layer of titanium 48, 500 angstroms thick, are applied in a similar manner to that previously described. A second layer interconnection photoresist mask (not shown) is formed with apertures above the apertures formed in layer 42 and in regions where a second set of interconnects between the elements is desired. The portions of layer 48, exposed through the aperture are removed by chemical etching with a solution of $NH_4F_4$ and $H_2O_2$ and connecting leads 49, 0.5 mil or more thick, are plated through the mask apertures onto the exposed portions of gold layer 47 to form the structure as shown in FIG. 8*a*. The photoresist mask is then removed by a solvent and the portions of layer 48 between the leads 49 are then removed by chemical etching with a titanium etch. Portions of gold layer 47 between leads 48 are then removed by chemical etching with a gold etch, or by sputter etching which also removes a small amount of the leads 49, and layer 46 is then removed by a titanium etch to form the final structure as shown in FIG. 8*b*.

Any number of layers of interconnections may be built up in the foregoing manner. If the second layer of interconnections is an intermediate layer, the photoresist mask may be used to form a titanium layer sputter etch mask over the desired interconnect region as described for the first interconnect layer. The finished assembly may have an insulating protective layer of silicon dioxide or epoxy applied thereto for surface protection. The final and/or any intermediate layer of interconnections may provide the beam leads for interconnection with a printed circuit support illustrated in FIG. 6.

This completes the description of the embodiment of the invention illustrated herein; however, many modifications thereof will be apparent to persons skilled in the art without departing from the spirit and scope of this invention. For example, other metals and materials can be used for the lead-ins and the barrier layer and other material such as aluminum oxide can be used as a passivation layer for the semiconductor. In addition, the invention can be used to form multilayer leads which cross one another on the surface of the chip or on which are grown additional layers for the formation of electric components for a stacked configuration. Also, such metal layer can be focused on surface regions other than on planar regions such as sloping walls of mesa semiconductor regions formed for example in an epitaxial layer by the preferential or anisotropic etching as heretofore described for separation of the chips from the wafer. Accordingly, it is intended that this invention be not limited by the particular details of the embodiments illustrated therein except as defined by the appended claims.

What is claimed is:

1. A method of selectively removing material from a body comprising sputter etching a surface of said body in an atmosphere having a constituent which reacts with a subsurface layer adjacent at least portions of said surface to form a compound which is removed by sputter etching at a substantially lower rate than other material of said body.

2. The method in accordance with Claim 1 wherein said constitutent comprises oxygen.

3. The method in accordance with Claim 2 wherein said layer comprises a metal which reacts with oxygen.

4. The combination in accordance with Claim 3 wherein said metal comprises titanium.

5. The combination in accordance with Claim 4 wherein said atmosphere comprises argon.

6. The combination in accordance with Claim 5 wherein said sputter etching is performed in an electric field.

7. The combination in accordance with Claim 6 wherein said other material comprises gold or platinum.

8. The method of forming an integrated circuit comprising:

forming a plurality of active elements in a body of semiconductor material;

forming a plurality of multilayer conductors interconnecting said active elements, and formed of a plurality of layers of metals deposited over an insulating layer on said body; and removing portions of said metal layers by sputter etching in an atmosphere having a constituent which reacts with a subsurface layer of said layers to form a compound which sputter etches at a slower rate than another of said layers.

9. The method in accordance with Claim 8 wherein said semiconductor body comprises silicon.

10. The method in accordance with Claim 9 wherein said insulating surface comprises a layer of silicon dioxide.

11. The method in accordance with Claim 10 wherein said insulating layer comprises a passivation layer of silicon nitride.

12. The method in accordance with Claim 11 wherein said insulating layer has apertures formed therein through which said conductors contact said active semiconductor elements.

13. The method in accordance with Claim 12 wherein said conductors are bonded to said elements with a bonding layer comprising platinum silicide.

14. The method in accordance with Claim 13 wherein said multilayer is vapor or sputter deposited.

15. The method in accordance with Claim 14 wherein said multilayer comprises a titanium layer covered with a platinum layer.

16. The method in accordance with Claim 15 wherein said platinum layer is covered with a layer of gold.

17. The method of forming an integrated circuit comprising:

forming a body of semiconductor material having an epitaxial surface layer in the [100] crystallographic plane;

forming active semiconductor elements in said surface layer;

interconnecting said elements with a conductive matrix of a plurality of layers of metal positioned on an insulating layer on said surface; and said conductive matrix being formed by coating said insulating layer with a plurality of said metal layers which contact said active semiconductor elements through apertures in said insulating layer with the upper metal layer being thickened in the regions where interconnections of said elements are desired and the metal between said regions being removed by sputter etching in an atmosphere which reacts with the metal of the lower of said metal layers to form a compound which is removed by sputter etching at a lower rate than said upper layer.

18. The method in accordance with Claim 17 wherein portions of said thickened metal layer extend beyond the boundary of said surfaces and said body of semiconductor material has been separated from other bodies of semiconductor material by selective etching of said silicon.

19. The method in accordance with Claim 18 wherein said body is positioned with said active elements adjacent to a supporting substrate having an insulating surface with conductors positioned thereon in registry with portions of said thickened metal layer which extend beyond said surface.

References Cited

UNITED STATES PATENTS

| | | | |
|---|---|---|---|
| 3,479,269 | 11/1969 | Byrnes, Jr. et al. | 204—298 X |
| 3,689,392 | 9/1972 | Sandera | 204—192 |
| 3,661,747 | 5/1972 | Byrnes, Jr. et al. | 204—192 |

JOHN H. MACK, Primary Examiner

D. R. VALENTINE, Assistant Examiner

U.S. Cl. X.R.

117—107, 217

UNITED STATES PATENT OFFICE
CERTIFICATE OF CORRECTION

Patent No. 3,836,446 Dated September 17, 1974

Inventor(s) Karl H. Tiefert

It is certified that error appears in the above-identified patent and that said Letters Patent are hereby corrected as shown below:

Claim 4, column 7, line 9, after "The", delete "combination", and add -- method --.

Claim 5, column 7, line 11, after "The", delete "combination", and add -- method --.

Claim 6, column 7, line 13, after "The", delete "combination", and add -- method --.

Claim 7, column 7, line 15, after "The" delete "combination", and add -- method --.

Signed and sealed this 15th day of April 1975.

(SEAL)
Attest:

RUTH C. MASON
Attesting Officer

C. MARSHALL DANN
Commissioner of Patents
and Trademarks

ORM PO-1050 (10-69)

USCOMM-DC 60376-P69
☆ U.S. GOVERNMENT PRINTING OFFICE : 1969 O—366-334